United States Patent [19]

Ju

[11] Patent Number: 5,644,549

[45] Date of Patent: Jul. 1, 1997

[54] APPARATUS FOR ACCESSING AN EXTENDED DATA OUTPUT DYNAMIC RANDOM ACCESS MEMORY

[75] Inventor: Jiang-Tsuen Ju, Hsinchu, Taiwan

[73] Assignee: Act Corporation, Hsinchu, Taiwan

[21] Appl. No.: 619,436

[22] Filed: Mar. 21, 1996

[51] Int. Cl.⁶ .................................................. G11C 8/00
[52] U.S. Cl. .................... 365/235; 365/189.05; 365/233; 365/238.5
[58] Field of Search ................................. 365/235, 238.5, 365/189.05, 193, 233

[56] References Cited

U.S. PATENT DOCUMENTS

| | | | |
|---|---|---|---|
| 5,398,213 | 3/1995 | Yeon et al. | 365/238.5 |
| 5,457,659 | 10/1995 | Schaefer | 365/222 |
| 5,526,320 | 6/1996 | Zagar et al. | 365/233.5 |
| 5,530,955 | 6/1996 | Kaneko | 395/431 |

*Primary Examiner*—David C. Nelms
*Assistant Examiner*—Hien Nguyen
*Attorney, Agent, or Firm*—Ladas & Parry

[57] ABSTRACT

An apparatus for accessing an extended data output dynamic random access memory (EDO DRAM) is disclosed. A conventional fast page mode (FPM) DRAM is converted by the present invention to conform to an EDO DRAM. The present invention comprises a conventional FPM DRAM, a read-cycle generating circuit for generating a signal that defines a read cycle, a flip-flop for latching data signals from the FPM DRAM, an output control circuit for generating a control signal to control a data switch that will pass the latched data signals. The data signals come directly from the FPM DRAM and the latched data signals come from the data switch are combined to form extended data signals coupled to a system data bus.

20 Claims, 6 Drawing Sheets

APPARATUS FOR ACCESSING AN EXTENDED DATA OUTPUT DYNAMIC RANDOM ACCESS MEMORY

BACKGROUND OF THE INVENTION

1. Field of the Invention

The present invention relates to an apparatus for accessing a dynamic random access memory (DRAM), and more particularly to an apparatus for converting a conventional fast page mode DRAM to conform to the specification of an extended data output (EDO) DRAM.

2. Description of the Prior Art

Dynamic random access memory (DRAM) is one of important elements used in almost every digital electronic system, such as a personal computer or a video graphics array (VGA) adapter. More than ninety percent of those DRAM chips which are employed in electronic devices and are available in stock belong to fast page mode (FPM) type DRAM as shown in FIG. 1. When the row address strobe (RAS/) signal from a central processing unit (CPU) goes low, the DRAM 10 accepts the supplied address from system address bus 12 and uses it as a row address. If the column address strobe (CAS/) signal is low, the DRAM 10 accepts the supplied address from system address bus 12 and uses it as a column address. When the read/write (WE/) signal, which is also called write enable signal, goes low, the DRAM 10 carries out a write operation; otherwise data is read from a system data bus 14. While the signal at the output enable (OE/) pin is low, the data from the DRAM 10 are coupled to the system data bus 14.

FIG. 2 shows a typical timing diagram of the FPM DRAM. At the transition when the signal CAS/ goes from low to high, the valid data N on the system data bus are deactivated as designated in number 20. Before CAS/ goes low again to activate another valid data N+1, a precharge time 22 is required during which there is no valid data on the bus. Therefore, the CAS/ has to stay low wastefully before the data are no longer needed.

Even though the speed of the FPM DRAM is improved somewhat by the improvement in semiconductor technology, it is still unable to catch up with the other elements, such as a CPU, of the system. Consequently some evolutionary DRAMs such as EDRAM, SDRAM and CDRAM or some revolutionary ones such as Rambus DRAM are designed to overcome drawback of a conventional FPM DRAM. However, those new type DRAMs, which work in quite different ways when compared with the FPM DRAM, accommodate difficultly to most today's system architectures.

Extended data output (EDO) DRAM is one exception that utilizes the same control signals and the same coupling as described in FIG. 1. Owing to some modification in the timing, the EDO DRAM largely improves its performance for more than forty percentage. FIG. 2B shows a timing diagram of an EDO DRAM. At the transition when the signal CAS/ goes from low to high designated as 24, the valid data N will not be turned down until the CAS/ goes low again. As a consequence, a precharge 26 can be performed before the valid data N are deactivated. Noticeably, the valid data will be turned down when signal OE/ is high, or signal WE/ is low, or both signals RAS/ and CAS/ go high.

While some chip sets that can manipulate EDO DRAM are employed in some electronic systems, the EDO DRAM is at a disadvantage when compared with the FPM DRAM regarding to the price and availability. Therefore, a need has arisen for an adapter that can convert a FPM DRAM to conform to the specification of an EDO DRAM.

SUMMARY OF THE INVENTION

The present invention provides an apparatus for converting a conventional fast page mode dynamic random access memory (EDO DRAM) in order to conform to the specification of an extended data output (EDO) DRAM. As a consequence of this adaptation, improved performance can be achieved in low cost. The present invention comprises a conventional FPM DRAM, a first NOT gate for inverting logically a column address strobe signal, a first flip-flop for inputting the inverted column address strobe signal coupled to the clock input of the first flip-flop, a second NOT gate for inverting logically a row address strobe signal, an AND gate for inputting the inverted row address strobe signal and a read/write signal and for generating a end-cycle signal coupled to the reset input of the first flip-flop, some second flip-flops for inputting the data signals from the FPM DRAM and for inputting the column address strobe signal coupled to the clock inputs of the second flip-flops, a tri-input NAND gate for generating an output control signal, and some tri-state buffers that will pass the latched data from the outputs of the second flip-flops according to the output control signal.

DESCRIPTION OF THE PREFERRED EMBODIMENT

Figure 1:
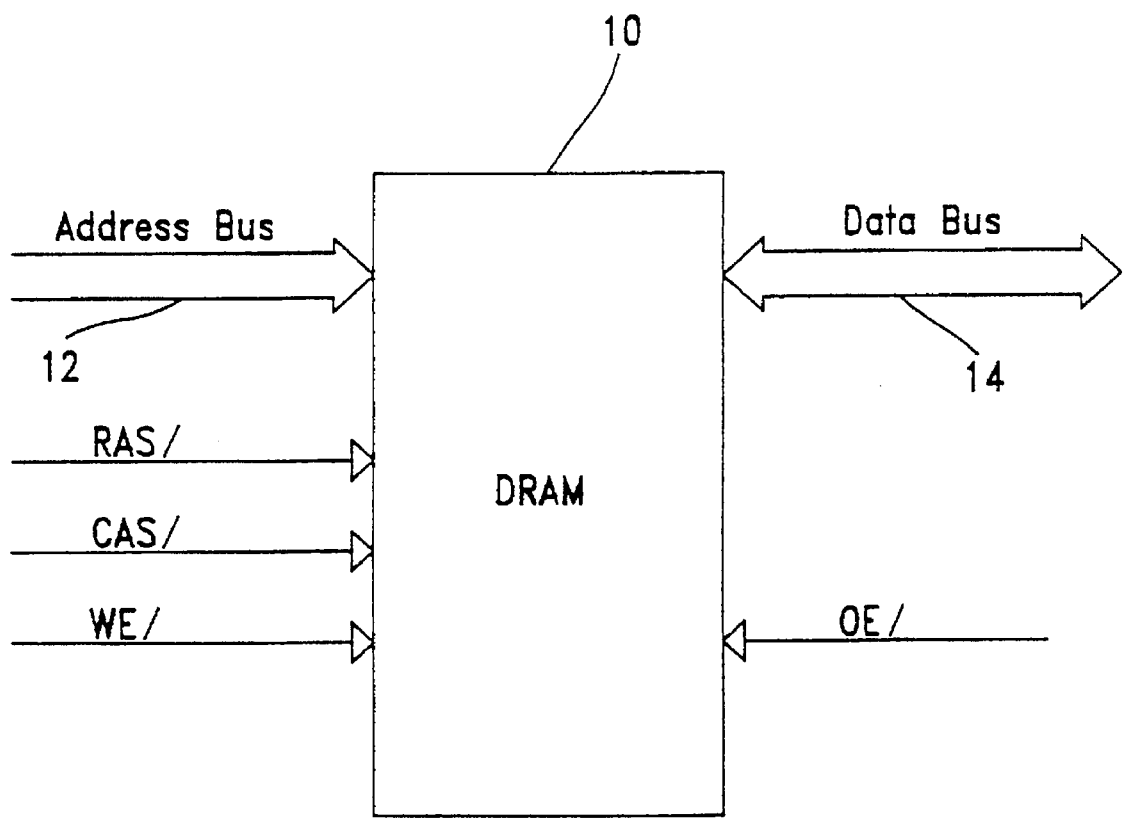
FIG. 1 is a block diagram of a convention fast page mode (FPM) DRAM.
Figure 2A:
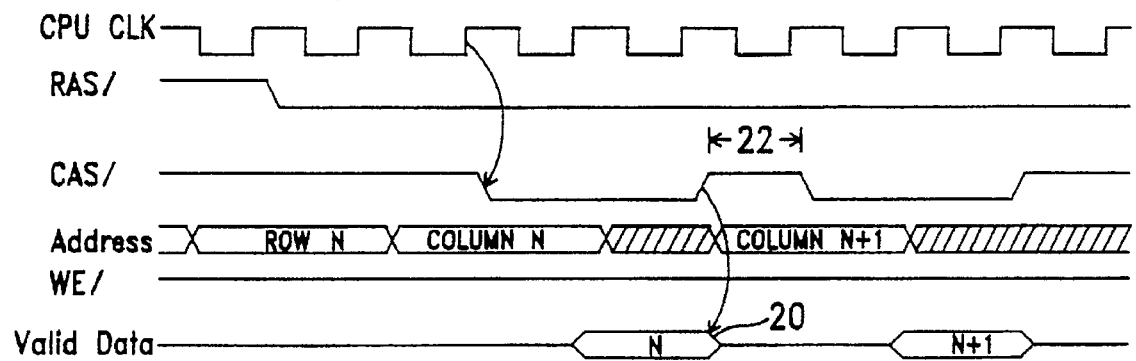
FIG. 2A is a timing diagram of the FPM DRAM.
Figure 2B:
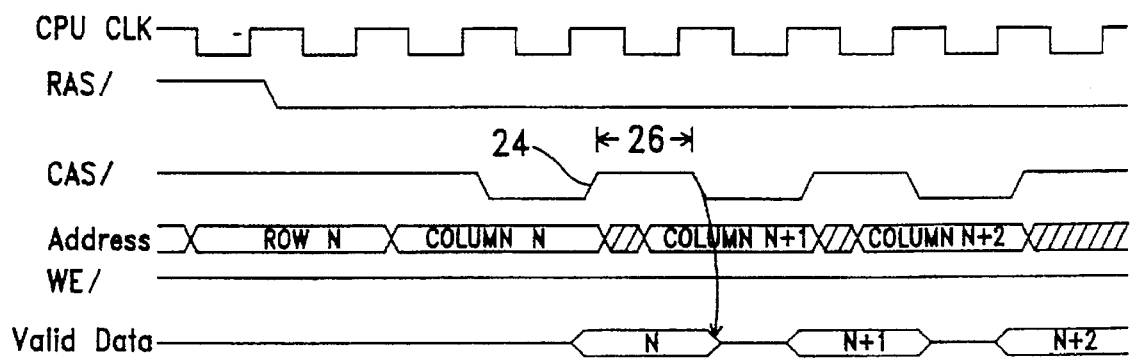
FIG. 2B is a timing diagram of an extended data output (EDO) DRAM.
Figure 3:
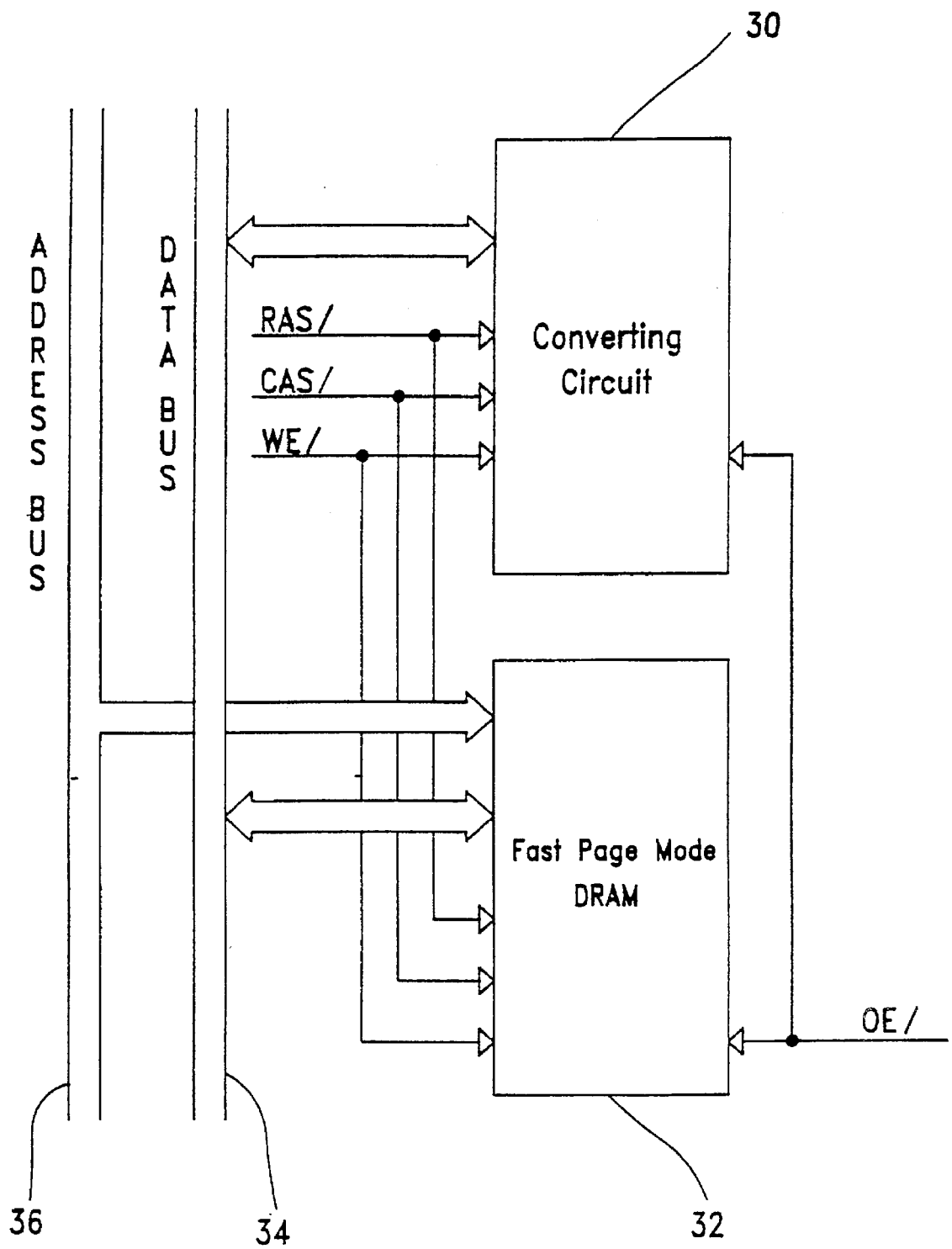
FIG. 3 is block diagram of the best embodiment of the present invention.

FIG. 3 shows a functional block diagram of the present invention. Both converting circuit 30 and fast page mode dynamic random access memory (FPM DRAM) 32 connect electrically to system data bus 34 and system address bus 36, and receive column address strobe (CAS/) signal, row address strobe (RAS/) signal, read/write (WE/) signal and output enable (OE/) signal from a central processing unit (CPU).

Figure 4:
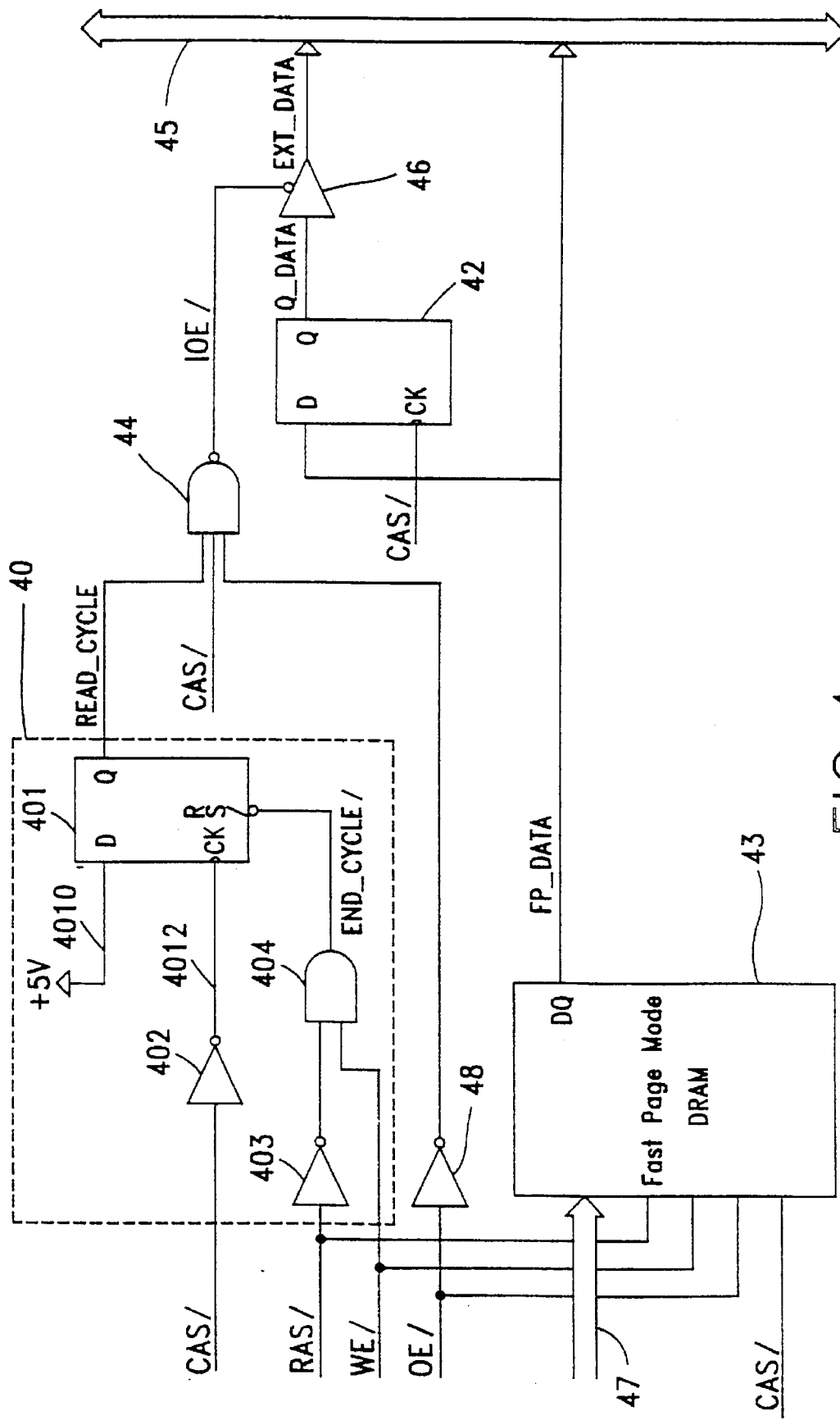
FIG. 4 shows a circuit of the present invention that can access 1 data bit.
Figure 5:
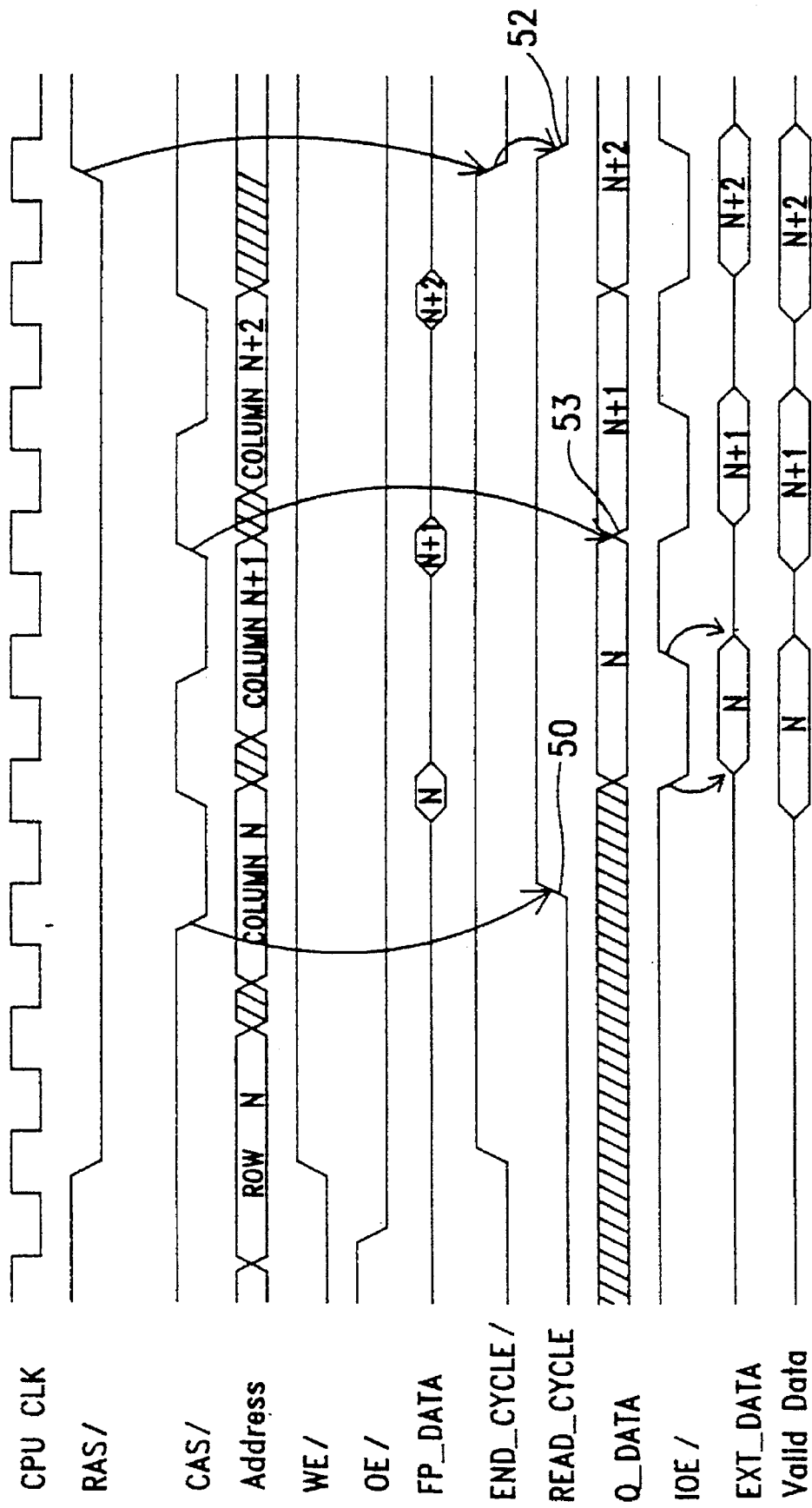
FIG. 5 is a timing diagram of the circuit in FIG. 4.
Figure 6:
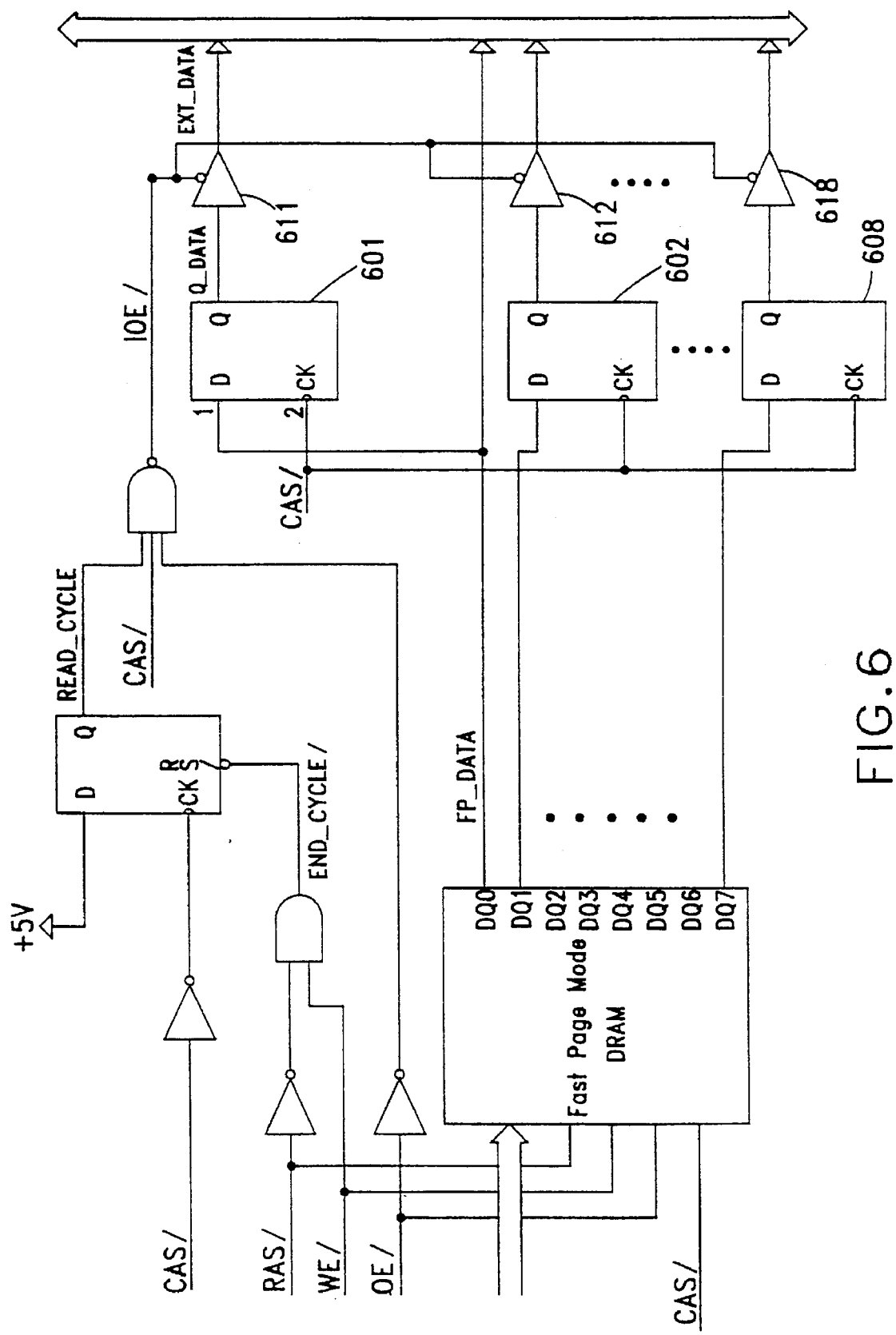
FIG. 6 shows a circuit of the present invention that can access 8 data bits.

FIG. 4 shows the circuit of the best embodiment of the present invention. Further, FIG. 5 shows a timing diagram in connection with the circuit of FIG. 4. For the simplicity of demonstration, only one bit of data is shown in FIG. 4. For a general case, a circuit with eight data bits is shown in FIG. 6.

Referring to FIG. 4, read-cycle generating circuit 40 inputs signals CAS/, RAS/ and WE/ so that a generated read_cycle signal is used to define a read cycle for the present invention. Inside this read-cycle generating circuit, a D-type flip-flop 401 has its D-input pin 4010 pull high, and has its clock input pin 4012 couple to an inverted CAS/ signal which is inverted logically by a NOT gate 402. As a consequence, when signal CAS/ goes from high to low, that is, the clock input 4012 goes from low to high, the read_cycle signal becomes high 50 as shown in FIG. 5. Both signal WE/ and an inverted RAS/, which is inverted by a NOT gate 403, are input to an AND gate 404 in order to generate a reset signal which is then coupled to a reset input pin of the flip-flop 401. Therefore, either signal RAS/ becomes high or signal WE/ becomes low, the signal reset will be asserted low so as to reset the flip-flop 401 and finish one read cycle as shown at the time 52 in FIG. 5. Another D-type flip-flop 42 is used to latch data from the FPM DRAM 43. The latched data will be updated whenever the signal CAS/ goes high.

The output IOE/ of tri-input NAND gate 44 is used to control a tri-state buffer 46 to decide when the latched data Q_DATA could be passed through the buffer 46 to the system data bus 45. The signal IOE/ is asserted low only when all signals read_cycle, CAS/ and inverted OE/ are high where the signal OE/ is inverted by a NOT gate 48.

The data signals that come directly from the FPM DRAM 43 and the latched data that pass through the buffer 46 are connected parallelly to the system data bus 45, resulting in an extended output signals which conform to the specification of an extended data output (EDO) DRAM as shown in the timing of valid data in FIG. 5.

The circuit shown in FIG. 6 has a capacity for generating eight extended data outputs. All circuit elements and the interconnection among them are the same as those shown in FIG. 4 except that duplicate latching flip-flops 601~608 and duplicate buffers 611~618 are employed.

Although specific embodiment has been illustrated and described, it will be obvious to those skilled in the art that various modifications may be made without departing from the spirit which is intended to be limited solely by the appended claims. For example, equivalent circuit that performs the same logical operation of the best embodiment will be included in the scope of the claims. Further, the flip-flops used in the embodiment can be replaced by other types of flip-flops such as JK-type flip-flops or RS-type flip-flops. Moreover, portion of the embodiment can be combined to a single circuit element that functions in the same way. For example, instead of using flip-flop 42 and buffer 46 in FIG. 4, we can utilize a single flip-flop that has tri-state output and is controlled by a control signal.

What is claimed is:

1. An apparatus for accessing an extended data output dynamic random access memory (EDO DRAM), said apparatus comprising:

a fast page mode (FPM) DRAM for inputting a column address strobe signal, a row address strobe signal, a read/write signal, an output enable signal and a plurality of memory address signals, and for generating a plurality of fast page mode (FPM) data signals coupled to a system data bus;

read-cycle generating means for inputting said column address strobe signal, said row address strobe signal and said read/write signal, and for generating a read-cycle signal;

data latching means for inputting said column address strobe signal, said plurality of fast page mode (FPM) data signals, and for generating a plurality of latched data signals;

output control means for inputting said read-cycle signal, said column address strobe signal and said output enable signal, and for generating an output control signal, and a data switch for inputting said output control signal and said plurality of latched data signals, and for generating a plurality of extended data signals coupled to the system data bus.

2. The apparatus according to claim 1, wherein said read-cycle generating means comprises:

a first NOT gate for inverting logically said column address strobe signal;

a first flip-flop for inputting the inverted column address strobe signal coupled to the clock input of said first flip-flop, wherein an input of said first flip-flop is coupled to a high logic state; and reset means for inputting said row address strobe signal and said read/write signal, and for generating a reset signal coupled to the reset input of said first flip-flop.

3. The apparatus according to claim 2, wherein said first flip-flop is a D-type flip-flop having a D input to a logical high voltage.

4. The apparatus according to claim 2, wherein said reset means comprises:

a second NOT gate for inverting said row address strobe signal; and an AND gate for inputting said inverted row address strobe signal and said read/write signal, and for generating said reset signal.

5. The apparatus according to claim 2, wherein said data latching means comprises a plurality of second flip-flops for inputting said plurality of fast page mode (FPM) data signals and said column address strobe signal coupled to the clock inputs of said plurality of second flip-flops.

6. The apparatus according to claim 4, further comprising a third NOT gate for inverting logically said output enable signal.

7. The apparatus according to claim 6, wherein said output control means comprises a tri-input NAND gate for inputting said read-cycle signal, said column address strobe signal and said inverted output enable signal, and for generating said output control signal.

8. The apparatus according to claim 1, wherein said data switch comprises a plurality of tri-state buffers for inputting said plurality of latched data and said output control signal, and for generating said plurality of extended data signals coupled to the system data bus.

9. An apparatus for accessing an extended data output dynamic random access memory (EDO DRAM), said apparatus comprising:

a fast page mode (FPM) DRAM for inputting a column address strobe signal, a row address strobe signal, a read/write signal, an output enable signal and a plurality of memory address signals, and for generating a plurality of fast page mode (FPM) data signals coupled to a system data bus;

a first NOT gate for inverting logically said column address strobe signal;

a first flip-flop for inputting the inverted column address strobe signal coupled to the clock input of said first flip-flop, and for generating a read-cycle signal, wherein an input of said first flip-flop is coupled to a high logic state;

a second NOT gate for inverting said row address strobe signal;

an AND gate for inputting said inverted row address strobe signal and said read/write signal, and for generating a reset signal, wherein said reset signal is coupled to a reset input of said first flip-flop;

a plurality of second flip-flops for inputting said plurality of fast page mode (FPM) data signals and said column address strobe signal coupled to the clock inputs of said plurality of second flip-flops, thereby generating a plurality of latched data;

a third NOT gate for logically inverting said output enable signal, thereby generating an inverted output enable signal;

a tri-input NAND gate for inputting said read-cycle signal, said column address strobe signal and said inverted output enable signal, and for generating an output control signal; and a plurality of tri-state buffers for inputting said plurality of latched data and said output control signal, and for generating a plurality of extended data signals coupled to the system data bus.

10. The apparatus according to claim 9, wherein said first flip-flop is a D-type flip-flop having a D input couple to a logical high voltage.

11. An apparatus for accessing an extended data output dynamic random access memory (EDO DRAM), said apparatus comprising:

read-cycle generating means for inputting a column address strobe signal, a row address strobe signal and a read/write signal, and for generating a read-cycle signal;

data latching means for inputting said column address strobe signal, a plurality of fast page mode data signals, and for generating a plurality of latched data signals, wherein said fast page mode data signals are generated by an extended data output DRAM;

output control means for inputting said read-cycle signal, said column address strobe signal and an output enable signal, and for generating an output control signal; and a data switch for inputting said output control signal and said plurality of latched data signals, and for generating a plurality of extended data signals coupled to the system data bus.

12. The apparatus according to claim 11, wherein said read-cycle generating means comprises:

a first NOT gate for inverting logically said column address strobe signal;

a first flip-flop for inputting the inverted column address strobe signal coupled to the clock input of said first flip-flop, wherein an input of said first flip-flop is coupled to a high logic state; and reset means for inputting said row address strobe signal and said read/write signal, and for generating a reset signal coupled to the reset input of said first flip-flop.

13. The apparatus according to claim 12, wherein said first flip-flop is a D-type flip-flop having a D input couple to a logical high voltage.

14. The apparatus according to claim 12, wherein said end-cycle generating means comprises:

a second NOT gate for inverting said row address strobe signal; and an AND gate for inputting said inverted row address strobe signal and said read/write signal, and for generating said reset signal.

15. The apparatus according to claim 11, wherein said data latching means comprises a plurality of second flip-flops for inputting said plurality of fast page mode data signals and said column address strobe signal coupled to the clock inputs of said plurality of second flip-flops.

16. The apparatus according to claim 14, further comprising a third NOT gate for inverting logically said output enable signal.

17. The apparatus according to claim 16, wherein said output control means comprises a tri-input NAND gate for inputting said read-cycle signal, said column address strobe signal and said inverted output enable signal, and for generating said output control signal.

18. The apparatus according to claim 11, wherein said data switch comprises a plurality of tri-state buffers for inputting said plurality of latched data and said output control signal, and for generating said plurality of extended data signals coupled to the system data bus.

19. An apparatus for accessing an extended data output dynamic random access memory (EDO DRAM), said apparatus comprising:

a first NOT gate for inverting logically a column address strobe signal;

a first flip-flop for inputting the inverted column address strobe signal coupled to the clock input of said first flip-flop, and for generating a read-cycle signal wherein an input of said first flip-flop is coupled to a high logic state;

a second NOT gate for inverting a row address strobe signal;

an AND gate for inputting said inverted row address strobe signal and a read/write signal, and for generating a reset signal, wherein said reset signal is coupled to a reset input of said first flip-flop;

a plurality of second flip-flops for inputting a plurality of fast page mode data signals and said column address strobe signal coupled to the clock inputs of said plurality of second flip-flops, thereby generating a plurality of latched data, wherein said fast page mode data signals are generated by an extended data output DRAM;

a third NOT gate for logically inverting said output enable signal, thereby generating an inverted output enable signal;

a tri-input NAND gate for inputting said read-cycle signal, said column address strobe signal and said inverted output enable signal, and for generating an output control signal; and a plurality of tri-state buffers for inputting said plurality of latched data and said output control signal, and for generating a plurality of extended data signals coupled to a system data bus.

20. The apparatus according to claim 19, wherein said first flip-flop is a D-type flip-flop having a D input couple to a logical high voltage.

\* \* \* \* \*